US009667138B2

(12) United States Patent
Chen et al.

(10) Patent No.: US 9,667,138 B2
(45) Date of Patent: May 30, 2017

(54) DYNAMIC THRESHOLD GENERATOR FOR USE IN ADAPTIVE BODY BIASING OF A MOS

(71) Applicant: STMicroelectronics (Shenzhen) R&D Co. Ltd, Shenzhen (CN)

(72) Inventors: Min Chen, Shenzhen (CN); Wen Liu, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 0 days.

(21) Appl. No.: 14/825,267

(22) Filed: Aug. 13, 2015

(65) Prior Publication Data

US 2017/0040889 A1    Feb. 9, 2017

(30) Foreign Application Priority Data

Aug. 4, 2015  (CN) .......................... 2015 1 0472776

(51) Int. Cl.
*H02M 3/08*   (2006.01)
*G05F 3/20*   (2006.01)
*G05F 3/24*   (2006.01)

(52) U.S. Cl.
CPC .............. *H02M 3/08* (2013.01); *G05F 3/205* (2013.01); *G05F 3/242* (2013.01)

(58) Field of Classification Search
CPC .......... H02M 3/08; G05F 3/205; G05F 3/242; G05F 3/24
See application file for complete search history.

(56) References Cited

U.S. PATENT DOCUMENTS

| 5,397,934 | A  | * | 3/1995  | Merrill ..................... | G05F 3/242 327/534 |
| 6,075,404 | A  | * | 6/2000  | Shindoh .................. | G05F 3/205 327/535 |
| 6,313,691 | B1 | * | 11/2001 | Podlesny ............. | H03K 17/145 327/534 |
| 7,167,050 | B2 | * | 1/2007  | Suzuki .................. | H03F 3/3033 330/253 |
| 7,173,457 | B2 | * | 2/2007  | Kawasumi ............. | G11C 7/065 327/55 |
| 2010/0085344 | A1 | * | 4/2010 | Ogawa ................ | H03F 3/45183 345/211 |

* cited by examiner

*Primary Examiner* — Jung Kim
(74) *Attorney, Agent, or Firm* — Gardere Wynne Sewell LLP

(57) ABSTRACT

An electronic device includes a transistor having a body and a body biasing circuit. The body biasing circuit includes a threshold estimator circuit to estimate a threshold voltage of the transistor and a comparison circuit to compare the threshold voltage of the transistor to a reference threshold voltage and to generate a comparison signal based thereupon. A bias adjust circuit generates a body biasing voltage that biases the body of the transistor as a function of the comparison signal, the body biasing voltage being a voltage that, when applied to the body of the transistor, adjusts the threshold voltage thereof to be equal to the reference threshold voltage.

33 Claims, 6 Drawing Sheets

DYNAMIC THRESHOLD GENERATOR FOR USE IN ADAPTIVE BODY BIASING OF A MOS

PRIORITY CLAIM

This application claims priority from Chinese Application for Patent No. 201510472776.8 filed Aug. 4, 2015, the disclosure of which is incorporated by reference.

TECHNICAL FIELD

This disclosure is related to the field of MOS technology, and more particularly, to adaptive biasing of the bodies of CMOS transistors.

BACKGROUND

The development of integrated circuits having densely packed transistors is desirable. One technology that has been developed that allows transistors to be packed tightly together in an integrated circuit (IC) is deep submicron technology. However, the performance of different ICs produced using a same manufacturing process, even on a same wafer, differs.

In some scenarios, the thresholds of MOS transistors on a same IC may be higher, which results in a decrease of a maximum stable operating frequency for that IC and a lower leakage current. In other scenarios, the thresholds of the MOS transistors on a same IC may be lower, which results in an increase of the maximum stable operating frequency for that chip at the expense of a higher leakage current.

By fixed biasing the bodies of the MOS transistors, the thresholds thereof can be set, thereby potentially allowing for adjusting of the balance between operating frequency of the IC and the size of the leakage currents. While this is a useful technique, in some scenarios, further control of the thresholds of the MOS transistors may be desirable. Thus, further development in techniques for biasing the bodies of MOS transistors is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device disclosed herein includes a transistor having a body and a body biasing circuit. The body biasing circuit includes a threshold estimator circuit configured to estimate a threshold voltage of the transistor, and a comparison circuit configured to compare the threshold voltage of the transistor to a reference threshold voltage and to generate a comparison signal based thereupon. The body biasing circuit also includes a bias adjust circuit configured to generate a body biasing voltage that biases the body of the transistor as a function of the comparison signal, the body biasing voltage being a voltage that, when applied to the body of the transistor, adjusts the threshold voltage thereof to be equal to the reference threshold voltage.

The electronic device may include an additional transistor and an additional body biasing circuit. The additional body biasing circuit may include an additional threshold estimator circuit configured to estimate a threshold voltage of the additional transistor, and an additional comparison circuit configured to compare the threshold voltage of the additional transistor to an additional reference threshold voltage and to generate an additional comparison signal based thereupon. An additional bias adjust circuit may be configured to generate an additional body biasing voltage that biases the body of the additional transistor as a function of the additional comparison signal, the additional body biasing voltage being a voltage that, when applied to the body of the additional transistor, adjusts the threshold voltage thereof to be equal to the additional reference threshold voltage.

The bias adjust circuit may forward bias the body of the transistor in response to the comparison signal indicating that the threshold voltage is greater than the reference threshold voltage.

The transistor may be a PMOS transistor having a source and a body, and the bias adjust circuit may forward bias the body of the PMOS transistor by setting the body biasing voltage to be less than a voltage at the source of the PMOS transistor.

The transistor may be an NMOS transistor having a source and a body, and the bias adjust circuit may forward bias the body of the NMOS transistor by setting the body biasing voltage to be higher than a voltage at the source.

The bias adjust circuit may reverse bias the body of the transistor in response to the comparison signal indicating that the threshold voltage is less than the reference threshold voltage.

The transistor may be a PMOS transistor having a source and a body, and the bias adjust circuit may reverse bias the body of the PMOS transistor by setting the body biasing voltage to be greater than a voltage at the source.

The at least one MOS transistor may be an NMOS transistor, and the bias adjust circuit may reverse bias the body by setting the body biasing voltage to be less than a voltage at the source.

The electronic device may include an additional transistor having a body, and an additional threshold estimator circuit configured to estimate a threshold voltage of the additional transistor. The comparison circuit may be configured to compare the threshold voltage of the additional transistor to an additional reference threshold voltage and to generate an additional comparison signal based thereupon. The bias adjust circuit may also be configured to generate an additional body biasing voltage that biases the body of the additional transistor as a function of the additional comparison signal, the additional body biasing voltage being a voltage that, when applied to the body of the additional transistor, adjusts the threshold voltage thereof to be equal to the additional reference threshold voltage.

The bias adjust circuit may generate the body biasing voltage and additional body biasing voltage such that the threshold voltages of the transistor and additional transistor are equal.

The bias adjust circuit may generate the body biasing voltage and additional body biasing voltage such that the threshold voltages of the transistor and additional transistor are not equal.

The threshold estimator circuit may include a replicator circuit that is configured to receive the body biasing voltage as feedback and generate a replica of a gate to source voltage of the replica transistor, and a sample-hold circuit configured to store the replica of the gate to source voltage of the transistor responsive to first and second clocks and first and second reference currents so as to obtain first and second replica gate to source voltages. An integrator circuit may be configured to integrate a difference between the first replica gate to source voltage and the second replica gate to source voltage so as to produce the estimated threshold voltage of the transistor.

The transistor may be a PMOS transistor, and the replicator circuit may include a first replica PMOS transistor having a source coupled to a first supply voltage, a drain coupled to a first node, a gate coupled to a second node, and a body coupled to receive the body biasing voltage. A second PMOS transistor may have a drain coupled to the second node, a source coupled to the first node, and a gate. A first amplifier may have an inverting terminal coupled to the first node, a non-inverting terminal coupled to a first voltage, and an output coupled to the gate of the second PMOS transistor. First and second switches may be coupled to the second node, the first switch controlled by the first clock, the second switch controlled by the second clock. A second current source may be coupled between the first switch and ground, and a first current source may be coupled between the second switch and ground. The replica of the gate to source voltage change of the PMOS transistor may thus be reflected at the second node.

The sample-hold circuit may include a buffer having an input coupled the second node an output coupled to a third node, and a fourth switch coupled between the third node and a fourth node, the fourth switch configured to be closed at the second clock. A third switch may be coupled between the fourth node and one half a sum of the first voltage and the first supply voltage, the third switch configured to be closed at the first clock. A second capacitor may be coupled between the forth node and a fifth node, and a first capacitor may be coupled between the third node and the fifth node. A fifth switch may be coupled between the fifth node and ground, the fifth switch configured to be closed at the first clock. A sixth switch may be coupled between the fifth node and a sixth node, the sixth switch configured to be closed at the second clock.

The transistor may be an NMOS transistor, and the replicator circuit may include a first replica NMOS transistor having a source coupled to ground, a drain coupled to a first node, a gate coupled to a second node, and a body coupled to receive the body biasing voltage. A second NMOS transistor may have a source coupled to the first node, a drain coupled to the second node, and a gate. A first amplifier may have a non-inverting terminal coupled to a first voltage, an inverting terminal coupled to the first node, and an output coupled to the gate of the second NMOS transistor. First and second switches may be coupled to the second node, the first switch controlled by a first clock, the second switch controlled by a second clock. A first current source may be coupled between a first supply voltage and the second switch, and a second current source may be coupled between the first supply voltage and the first switch. The replica of the gate to source voltage change of the NMOS transistor may be reflected at the second node.

The sample-hold circuit may include a buffer having an input coupled the second node an output coupled to a third node, and a third switch coupled between the third node and a fourth node, the third switch configured to be closed at the first clock. A fourth switch may be coupled between the fourth node and one half the first voltage, the fourth switch configured to be closed at the second clock. A second capacitor may be coupled between the forth node and a fifth node, and a first capacitor may be coupled between the third node and the fifth node. A fifth switch may be coupled between the fifth node and ground, the fifth switch configured to be closed at the first clock, and a sixth switch may be coupled between the fifth node and a sixth node, the sixth switch configured to be closed at the second clock.

The integrator circuit may include a second amplifier having an inverting terminal coupled to the sixth node, a non-inverting terminal coupled to ground, and an output coupled to a seventh node. A third capacitor may be coupled between the sixth node and the seventh node, and a seventh switch may be coupled between the sixth node and the seventh node, the seventh configured to be closed at the first clock. The estimated threshold voltage of the transistor may thus be produced at the Nth node.

A method aspect is directed to a method including estimating a threshold voltage of a transistor, the threshold voltage being a voltage between a gate of the transistor and source of the transistor above which current flows between a drain of the transistor and the source of the transistor. The method may also include comparing the threshold voltage of the transistor to a reference threshold voltage, and generating a body biasing voltage that biases a body of the transistor as a function of the comparison, the body biasing voltage being a voltage that, when applied to the body of the transistor, adjusts the threshold voltage to be equal to the reference threshold voltage.

Estimating the threshold voltage of the transistor may include measuring a threshold voltage of a replica transistor having a same width to length ratio as the transistor.

Another aspect of an electronic device includes at least one transistor having a gate, a source, a drain, and a body, and a body biasing circuit. The body biasing circuit is configured to estimate a threshold voltage of the at least one transistor, the threshold voltage being a voltage between the gate and the source above which current flows between the drain and source, compare the threshold voltage of the at least one transistor to a reference threshold voltage, and generate a body biasing voltage that biases the body as a function of the comparison, the body biasing voltage being a voltage that, when applied to the body, adjusts the threshold voltage to be equal to the reference threshold voltage.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
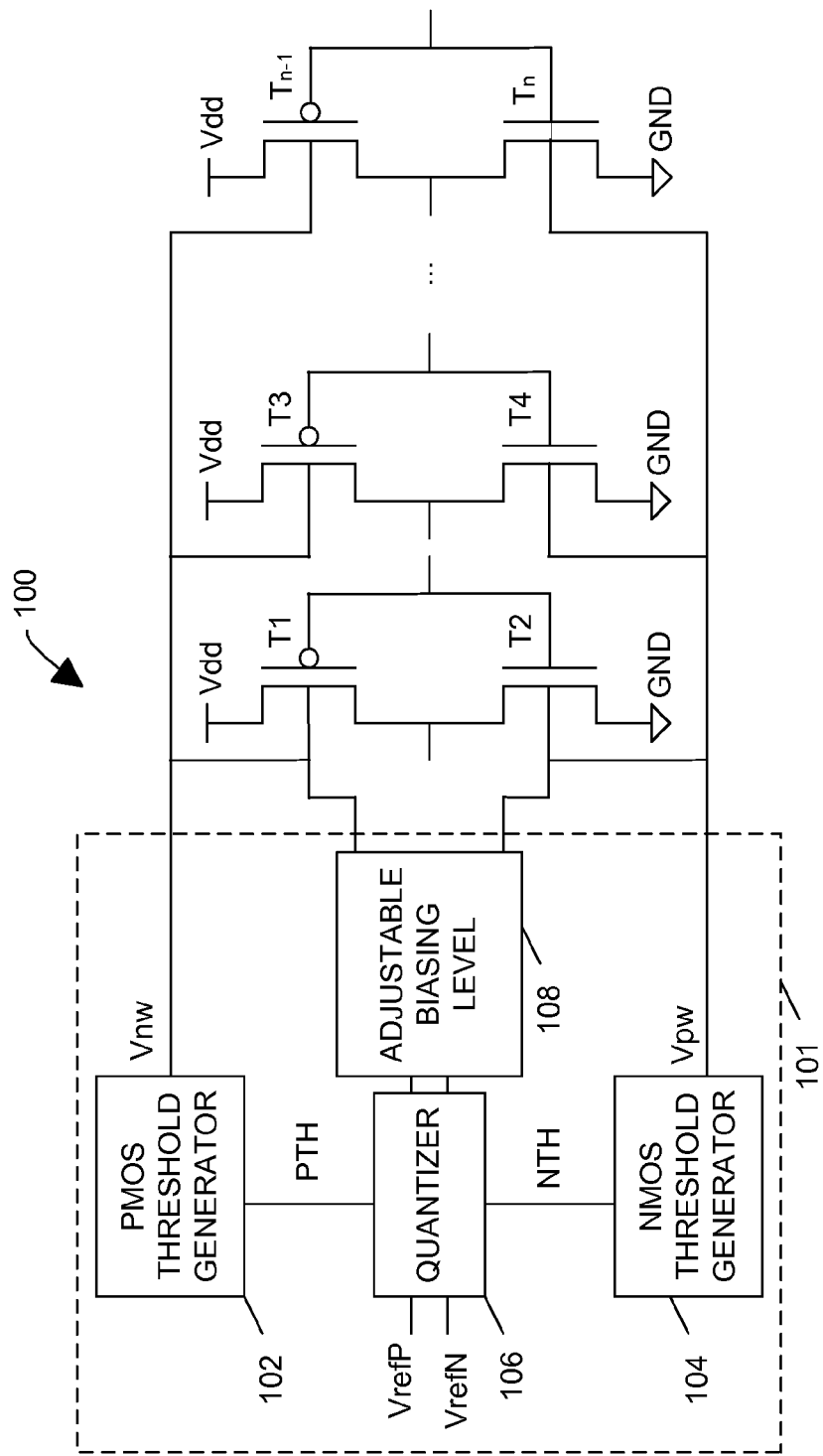
FIG. 1 is a schematic block diagram of an electronic device in accordance with this disclosure.

With initial reference to FIG. 1, an electronic device 100 is now described. The electronic device 100 is an integrated circuit, and includes two pairs of CMOS transistors T1, T2 and T3, T4, as well as body biasing circuit 101 for biasing the bodies of those transistors to thereby set the threshold voltages thereof. It should be understood the transistor pairs T1, T2 and T3, T4 are shown for simplicity, but the electronic device 100 may have any number of transistor pairs Tn-1, Tn. The body biasing circuit 101 may bias any number of CMOS transistors in the electronic device 100.

The body biasing circuit 101 includes a PMOS threshold generator 102 and an NMOS threshold generator 104. A quantizer 106 is coupled to both the PMOS threshold generator 102 and the NMOS threshold generator 104. An adjustable bias block 108 is coupled to the quantizer 106, and to the bodies of the transistors T1, T2, T3, T4. The PMOS threshold generator 102 is coupled to an output of the adjustable bias block 108 in a feedback loop, and the NMOS threshold generator 104 is coupled to another output of the adjustable bias block 108 in a feedback loop.

Transistor T1 is a PMOS transistor having its source coupled to a first supply source Vdd, and its body coupled to the adjustable bias block 108. Transistor T2 is an NMOS transistor having its drain coupled to the drain of transistor T1, its source coupled to ground GND, and its body coupled to the adjustable bias block 108. The gates of transistors T1 and T2 are coupled together.

Transistor T3 is a PMOS transistor having its source coupled to a first supply source Vdd, and its body coupled to the adjustable bias block 108. Transistor T4 is an NMOS transistor having its drain coupled to the drain of transistor T3, its source coupled to GND, and its body coupled to the adjustable bias block 108. The gates of transistors T3 and T4 are coupled together.

In operation, the PMOS threshold generator 102 estimates the threshold voltage of the PMOS transistor T1 and generates a signal Pth indicative thereof. Similarly, the NMOS voltage generator 104 estimates the threshold voltage of the NMOS transistor T2 and generates a signal Nth indicative thereof. Provided that T3 and T4 have a same size as T1 and T2, Pth and Vth are equally applicable. However, if T3 and T4 do not have the same size as T1 and T2, Pth and Nth will not be accurate for T3 and T4.

The threshold voltage is a voltage between the gate and source above which current flows between the drain and source, and is calculated as a function of the gate to source voltage Vgs1 of a transistor at a first time when flowing a first current Ids1, the gate to source voltage Vgs2 of a transistor at a second time when flowing a second current Ids2, the drain to source voltage of the transistor (Vds, that is common to the first time and second time), the drain to source current Ids1, and the drain to source current during the second time Ids2.

The drain to source currents Ids1 and Ids2 can be estimated as follows:

$$|Ids1| = UO*COX*\frac{Weff}{Leff}(1+\Lambda*|Vds|)\left(|Vgs1|-|Vth|-\frac{|Vds|}{2}\right)*|Vds|$$

$$|Ids2| = UO*COX*\frac{Weff}{Leff}(1+\Lambda*|Vds|)\left(|Vgs2|-|Vth|-\frac{|Vds|}{2}\right)*|Vds|$$

where UO is surface mobility, COX is oxide capacitance, A is channel-length modulation, Leff is effective MOS length, Weff is effective MOS width, Vgs is voltage between gate and source, Vds is voltage between drain and source, and Vth is threshold voltage.

The threshold voltage for each of the transistors T1, T2 can thus be estimated as:

$$|Vth| = \frac{(|Vgs1|-|Vgs2|)}{(k-1)} + |Vgs1| - \frac{|Vds|}{2}$$

where $$k = \frac{|Ids2|}{|Ids1|}$$

The quantizer 106 receives the estimated threshold voltage Pth of the PMOS transistor T1 compares it to a reference PMOS threshold voltage VrefP, and generates a first control signal to the adjustable bias block 108 based upon the comparison. The quantizer 106 also receives the estimated threshold voltage Nth of the NMOS transistor T2, compares it to the reference NMOS threshold voltage VrefN, and generates a second control signal to the adjustable bias block 108 based upon the comparison. The adjustable bias block 108 generates a PMOS biasing voltage for bodies of the transistors T1 and T3, in response to the first control signal. The adjustable bias block 108 also generates an NMOS biasing voltage for the bodies of the transistors T2 and T4 in response to the second control signal. It should be understood that if T3 and T4 are sized differently than T1 and T2, the biasing may result in their thresholds being different than T1 and T2, although this may be close enough in some instances.

When the estimated threshold voltage Pth of a PMOS transistors T1, T3 is greater than the reference PMOS threshold voltage VrefP, as determined by the quantizer 106, the adjustable bias block 108 forward biases the bodies of the transistors T1, T3. This is accomplished by setting the body biasing voltage to be less than a voltage at the source of the transistors T1, T3. When the estimated threshold voltage Nth of a NMOS transistor T2 is greater than the reference NMOS threshold voltage VrefN, as determined by the quantizer 106, the adjustable bias block 108 forward biases the bodies of the transistors T2, T4. This is accomplished by setting the body biasing voltage to be higher than a voltage at the source of the transistors T2, T4.

When the estimated threshold voltage Pth of the PMOS transistor T1 is less than the reference PMOS threshold voltage VrefP, as determined by the quantizer 106, the adjustable bias block 108 reverse biases the body of the transistors T1, T3. This is accomplished by setting the body biasing voltage to be greater than the voltage at the source of the PMOS transistors T1, T3. When the estimated threshold voltage Nth of the NMOS transistor T2 is less than the reference NMOS threshold voltage VrefN, as determined by the quantizer 106, the adjustable bias block 108 reverse biases the body of the transistors T2, T4. This is accomplished by setting the body biasing voltage to be less than the voltage at the source of the transistors T2, T4.

Figure 5:
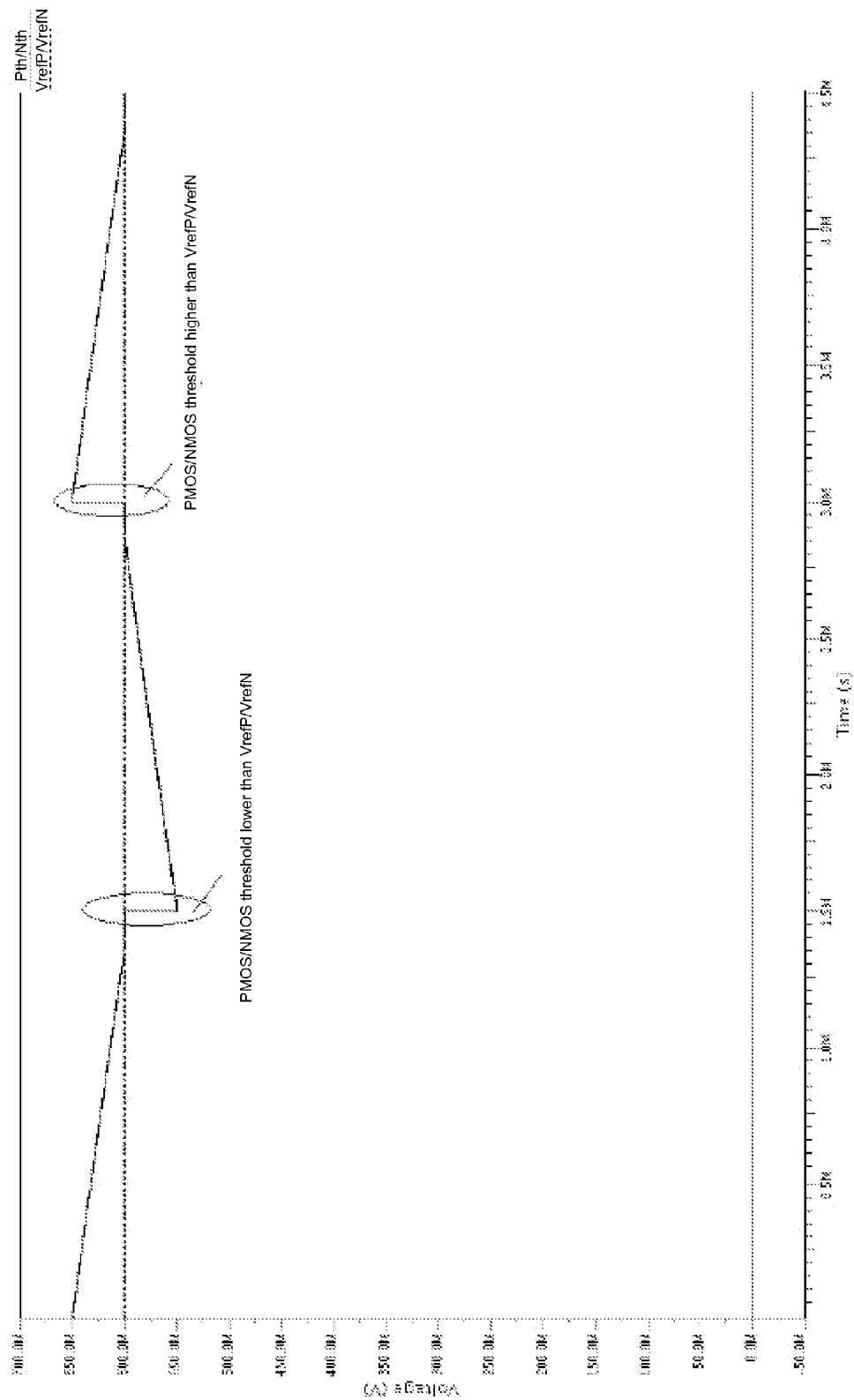
FIG. 5 is a graph showing alteration of the threshold of the transistors of FIG. 1 in accordance with this disclosure.

The quantizer 106 determines the difference between the estimated threshold voltages Nth and Pth and the reference threshold voltage VrefN and VrefP respectively, to generate the first and second signal applies to the adjustable bias block 108. The biasing signal Vpw or Vnw is then accordingly increased or decreased, which ultimately results in the threshold voltage Vth of the transistors (Vthp for the PMOS transistor T1, T3; Vthn for the NMOS transistors T2, T4) being adjusted to match the reference threshold voltage VrefN or VrefP. This process is shown in the timing diagram of FIG. 5.

Since the bodies of the PMOS transistors T1, T3 are coupled together the body biasing voltage therefore results in the threshold voltages thereof being equal provided that T1 and T3 are the same size. Likewise, since the bodies of the NMOS transistors T2, T4 are coupled together, the body biasing voltage therefore results in the threshold voltages thereof being equal provided that T2 and T4 are the same size. In some instances, the threshold voltages of the PMOS transistors T1, T3 may be set to be equal to the threshold voltages of the NMOS transistors T2, T4. Alternatively, in some instances, the threshold voltages of the PMOS transistors T1, T3 may be different than the threshold voltages of the NMOS transistors T2, T4.

Figure 2:
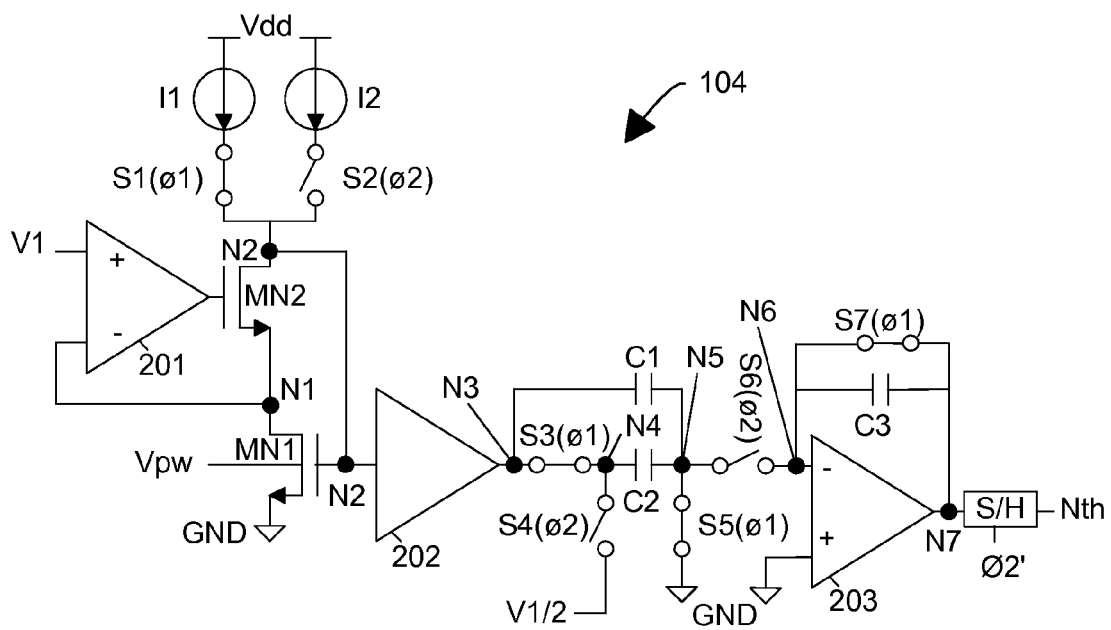
FIG. 2 is a detailed schematic diagram of the NMOS threshold generator of FIG. 1.

With reference to FIG. 2, the structure and function of the NMOS threshold generator 104 will now be described. The NMOS threshold generator includes a first amplifier 201 having an inverting terminal coupled to a first node N1, a non-inverting terminal coupled to a first voltage V1, and an output. A first replica NMOS transistor MN1 has a source coupled to GND a drain coupled to the first node N1, a gate coupled to a second node N2, and a body coupled to receive the biasing signal Vpw. The first replica NMOS transistor MN1 is a replica of the NMOS transistors T2, T4 in that it has a same width to length ratio. A second NMOS transistor MN2 has a source coupled to the first node N1, a drain coupled to the second node N2, and a gate coupled to the output of the first amplifier 201.

First and second switches S1, S2 are coupled to the second node N2. A first current source I1 is coupled between the first switch S1 and a first supply voltage Vdd, while a second current source I2 is coupled between the second switch S2 and the first supply voltage Vdd. The first switch S1 is controlled by a first clock ø1 and pass current from I1 to the drain of MN2, while the second switch S2 is controlled by a second clock ø2 and pass current from I2 to the drain of MN2.

A buffer 202 has an input coupled to the second node N2 and an output coupled to a third node N3. A third switch S3 is coupled between the third node N3 and a fourth node N4. A third switch S3 is controlled by the first clock ø1. A fourth switch S4 is coupled between the fourth node N4 and a voltage V1/2 equal to one half the first voltage V1. The fourth switch is controlled by the second clock ø2.

A first capacitor C1 is coupled between the third node N3 and the fifth node N5. A second capacitor C2 is coupled between the fourth node N4 and a fifth node N5. A fifth switch S5 is coupled between the fifth node N5 and GND. The fifth switch S5 is controlled by the first clock ø1. A sixth switch S6 is coupled between the fifth node N5 and a sixth node N6. The sixth switch S6 is controlled by the second clock ø2.

A second amplifier 203 has an inverting input coupled to the sixth node N6, a non-inverting input coupled to GND, and an output coupled to a seventh node N7. A third capacitor C3 is coupled between the sixth node N6 and the seventh node N7. A seventh switch S7 is coupled between the sixth node N6 and the seventh node N7. The seventh switch S7 is controlled by the first clock ø1. A sample hold block S/H has an input coupled to the seventh node N7, an output Nth, and is controlled by the second clock ø2'.

In operation, the amplifier 201 and the NMOS transistors MN1, MN2 form a feedback loop which controls the gate to source voltage of the replica NMOS transistor MN1. The currents I1 and I2 alternatively flow through the replica NMOS transistors MN1, MN2 at the assertion of the clocks ø1, ø2, respectively. Indeed, during the assertion of the clock ø1, switch S1 is closed and S2 is opened, so current I1 flows through the replica NMOS transistors MN1, MN2, causing the gate to source voltage of the replica NMOS transistor MN1 to go to Vgs1. During assertion of the clock ø2, switch S2 is closed while switch S1 is opened, so the current I2 will flow through the replica NMOS transistors MN1, MN2, causing the gate to source voltage of the replica NMOS transistor MN1 to go to Vgs2.

If the value of the first voltage V1 applied at the non-inverting terminal of the amplifier 201 is low, the voltage at the first node N1 is equal to V1 through the feedback loop formed by the amplifier 201 and replica NMOS transistors MN1, MN2. In this scenario, the replica NMOS transistor MN1 operates in the linear region and thus provides a linear voltage to current relationship, while the replica NMOS transistor MN2 operates in the saturation region which assists with dynamic adjusting of the gate to source voltage of the replica NMOS transistor MN1.

During assertion of the first clock ø1, the current I1 can be mathematically represented as:

$$I1 = UO * COX * \frac{Weff}{Leff}(1 + \Lambda * V1)\left[Vgs1(MN1) - Vth - \frac{V1}{2}\right] * V1$$

where Vgs1(MN1) is the gate to source voltage of MN1 when flowing current I1.

During assertion of the second clock ø2, the current I2 can be mathematically represented as:

$$I2 = UO * COX * \frac{Weff}{Leff}(1 + \Lambda * V1)\left[Vgs2(MN1) - Vth - \frac{V1}{2}\right] * V1$$

where Vgs2(MN1) is the gate to source voltage of MN1 transistor when flowing current I2.

Therefore, Vth can be reduced to:

$$Vth = \frac{Vgs1(MN1) - Vgs2(MN1)}{\frac{I2}{I1} - 1} + Vgs1(MN1) - V1/2$$

The buffer 201 can be considered to be an intermediate driver stage. A sample-hold circuit is formed by the amplifier 203, capacitors C1-C3, and switches S3-S7. During assertion of the clock ø1, switches S3, S5, and S7 are closed while switches S4 and S6 are opened. In addition, the voltage at the node N7 is reset to ground Gnd, and the nodes N3 and N4 are charged to the voltage Vgs1(MN1).

During assertion of the clock ø2, switches S4 and S6 are closed while switches S3, S5, and S7 are opened. In addition, the voltage at node N3 is changed to the voltage Vgs2(MN1) and the voltage at node N4 is changed to V1/2. The difference in voltage between V1/2 and Vgs1(MN1) is transferred to node N7 through the capacitors C2 and C3, while the difference between the voltages Vgs2(MN1) and Vgs1(MN1) is transferred to node N7 through the capacitors C1 and C3.

The voltage at node N7 (which can be referred to as Vout as it is at the output of the amplifier 203) is therefore:

$$Vout = [Vgs1(MN1) - Vgs2(MN1)] * \frac{C1}{C3} + \left[Vgs1(MN1) - \frac{V1}{2}\right] * \frac{C2}{C3}$$

Setting I1=I0, I2=I0*k, C1=C0/(k−1), C2=C3=C0, Vout can be mathematically represented as:

$$Vout = \frac{Vgs1(MN1) - Vgs2(MN1)}{I2/I1 - 1} + Vgs(MN1) - \frac{V1}{2} = Vth$$

Figure 4:
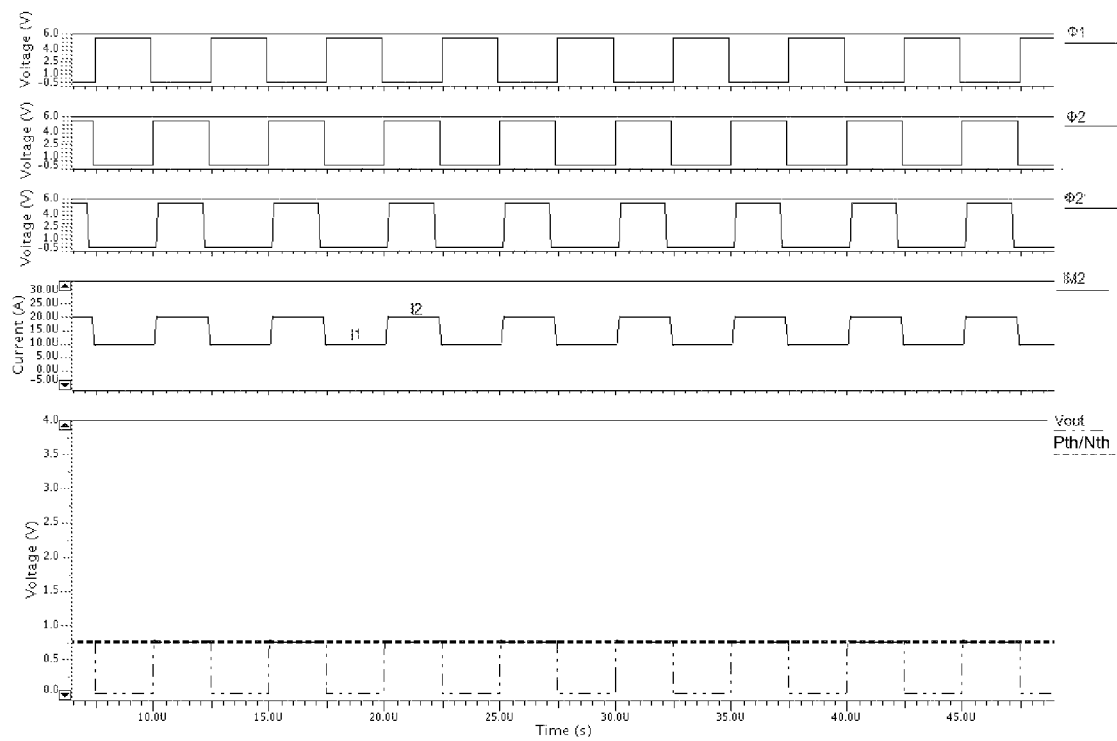
FIG. 4 is a timing diagram of the electronic device of FIG. 1 in operation.

Thus, during assertion of the clock ø1, the voltage at node N7 is reset to ground Gnd, and when during assertion of the clock ø2, the voltage at node N7 is charged to Vth. The output Nth is a sample hold output under ø2', wherein ø2' denotes a clock in phase with ø2 but having a narrower clock pulse. Output Nth is the threshold of the replica NMOS transistor NM1, and thus is the estimate of the threshold of the NMOS transistors T2, T4 (of FIG. 1). A timing diagram illustrating the above described operation is shown in FIG. 4.

Figure 3:
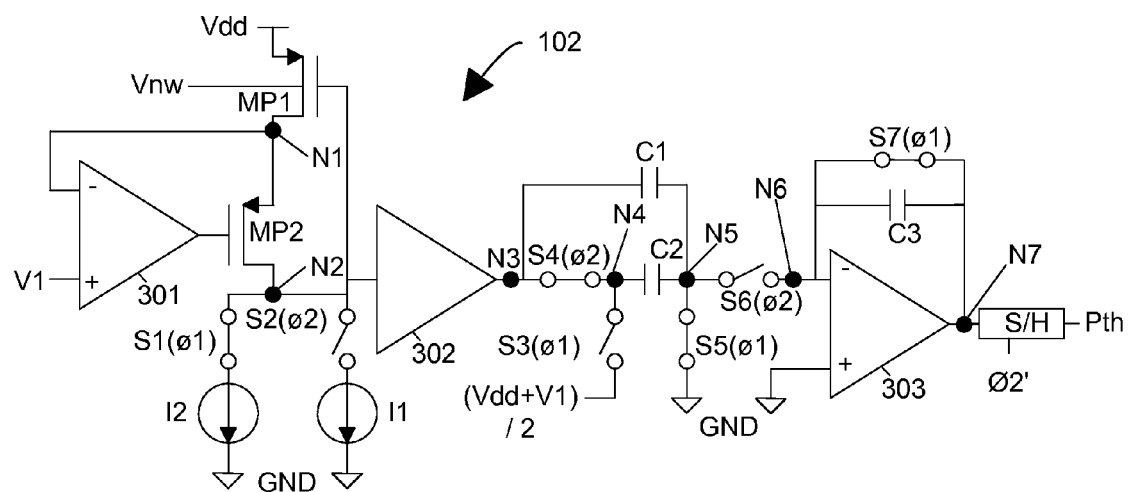
FIG. 3 is a detailed schematic diagram of the PMOS threshold generator of FIG. 1.

Referring now to FIG. 3, structure and function of the PMOS threshold generator 102 will now be described. The PMOS threshold generator 102 includes a first amplifier 301 having an inverting terminal coupled to a first node N1, a non-inverting terminal coupled to a first voltage V1, and an output. A first replica PMOS transistor MP1 has a source coupled to the first supply voltage Vdd, a drain coupled to a first node N1, a gate coupled to the second node N2, and a body coupled to receive the biasing signal Vnw. A second PMOS transistor MP2 has a source coupled to the first node N1, a drain coupled to the second node N2, and a gate coupled to the output of the first amplifier 301. The replica PMOS transistors MP1 has a same length and width as the PMOS transistors T1, T3.

First and second switches S1, S2 are coupled to the second node N2. The first switch S1 is controlled by the first clock ø1, and the second switch S2 is controlled by the second clock ø2. A second current source I2 is coupled between GND and the first switch S1. A first current source I1 is coupled between GND and the second switch S2.

A buffer 302 has an input coupled to the second node, and an output coupled to a third node N3. A fourth switch S4 is coupled between the third node N3 and a fourth node N4. The fourth switch S4 is controlled by the second clock. A third switch S3 is coupled between the fourth node N4 and a voltage (Vdd+V1)/2 equal to one half a sum of the first supply voltage Vdd and the first voltage V1. The fourth switch S4 is controlled by the second clock ø2.

A second capacitor C2 is coupled between the forth node N4 and a fifth node N5. A first capacitor C1 is coupled between the third node N3 and the fifth node N5. A fifth switch S5 is coupled between the fifth node N5 and GND. The fifth switch S5 is controlled by the first clock ø1. A sixth switch S6 is coupled between the fifth node N5 and a sixth node N6. The sixth switch S6 is controlled by the second clock ø2.

A second amplifier 302 has an inverting terminal coupled to the sixth node N6, a non-inverting terminal coupled to GND, and an output coupled to a seventh node N7. A third capacitor C3 is coupled between the sixth node N6 and the seventh node N7. A seventh switch S7 is coupled between the sixth node N6 and the seventh node N7. The seventh switch S7 is controlled by the first clock ø1. A sample hold circuit S/H has an input coupled to the seventh node N7, an output Pth, and is controlled by the second clock ø2.

Referring again to FIG. 1, the quantizer 106 has a third input coupled to the output Pth, a fourth input coupled to the reference threshold voltage VrefP, and an output. A bias adjust circuit 108 has an input coupled to the output of the quantizer, and an output coupled to the body of the PMOS transistors T1, T3.

In operation, during assertion of the clock ø1, the current I2 can be mathematically represented as:

$$I2 = UO * COX * \frac{Weff}{Leff}[1 + \Lambda * (Vdd - V1)]$$
$$\left[ Vsg2(MP1) - Vth - \frac{Vdd - V1}{2} \right] * (Vdd - V1)$$

During assertion of the clock ø2, the current I1 can be mathematically represented as:

$$I1 = UO * COX * \frac{Weff}{Leff}[1 + \Lambda * (Vdd - V1)]$$
$$\left[ Vsg1(MP1) - Vth - \frac{Vdd - V1}{2} \right] * (Vdd - V1)$$

Therefore, Vth can be reduced to:

$$Vth = \frac{Vsg1(MP1) - Vsg2(MP1)}{I2/I1 - 1} + Vsg1(MP1) - \frac{Vdd - V1}{2}$$

During assertion of the clock ø1, the current I2 flows through the replica PMOS transistors MP1 and MP2, and thus the corresponding gate voltage of the replica PMOS transistor MP1 is Vg2(MP1), and the voltage at node N7 is reset to ground Gnd. During assertion of the clock ø2, the current I1 flows through the replica PMOS transistors MP1 and MP2, and the gate voltage of the replica PMOS transistor MP1 is therefore Vg1(MP1). The voltage at node N7 (which can be referred to as Vout since it is the voltage at the output of the amplifier 303, is then:

$$Vout = [Vg2(MP1) - Vg1(MP1)]\frac{C1}{C3} + \left[\frac{Vdd + V1}{2} - Vg1(MP1)\right]\frac{C2}{C3}$$

Setting I1=I0, I2=I0*k, C1=C0/(k−1), and C2=C3=C0, Vout can then be calculated as:

$$Vout = \frac{Vg2(MP1) - Vg1(MP1)}{I2/I1 - 1} + \frac{Vdd + V1}{2} - Vg1(MP1)$$

Therefore, Vout can be represented as:

$$Vout = \frac{Vsg1(MP1) - Vsg2(MP1)}{I2/I1 - 1} + Vsg1(MP1) - \frac{Vdd - V1}{2} = Vth$$

The output Pth is a sample hold output under ø2', wherein ø2' denotes a same clock phase as ø2 but having a narrower clock pulse. Output Pth is the threshold of the replica PMOS transistor NP1, and thus is the estimate threshold of the PMOS transistors T1, T3 (of FIG. 1).

It should be appreciated that in some instances, it may be desirable for different transistors to have separately settable thresholds. In such an instance, there may be a different body biasing circuit for different transistors or different sets of transistors. Such an embodiment will now be described with reference to FIG. 1A.

Figure 1A:
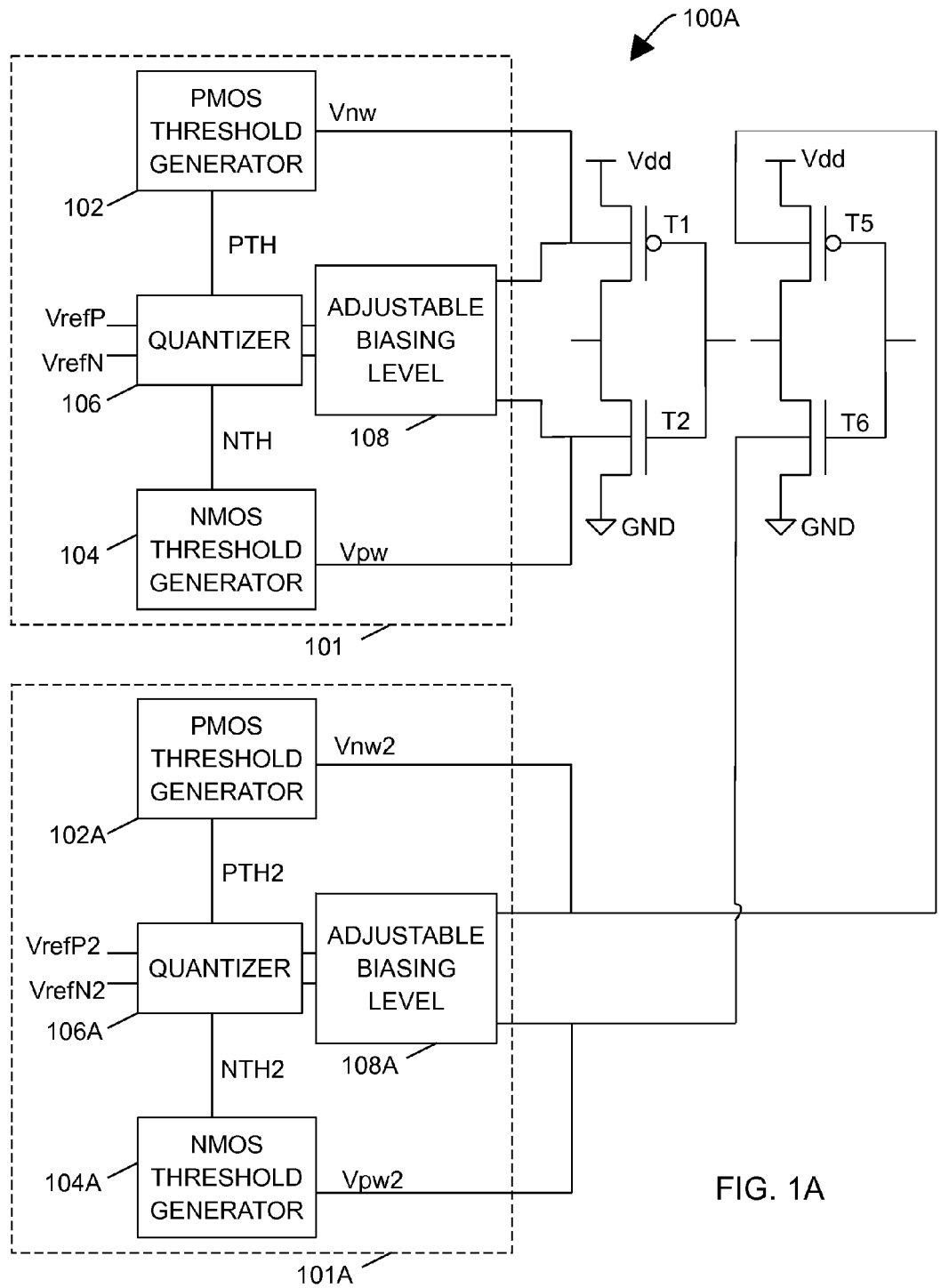
FIG. 1A is a schematic block diagram of an alternate embodiment of an electronic device in accordance with this disclosure.

Shown in FIG. 1A is an electronic device 100A. The electronic device 100A includes transistors T1, T2 that are as described above, and a body biasing circuit 101 for transistors T1, T2 that functions as described above. In addition, the electronic device 100A includes transistors T5, T6, with an additional body biasing circuit 101A for estimating the threshold of transistors T5, T6 and for biasing the bodies thereof so as to set the threshold of transistors T5, T6 at a desired level.

The additional body biasing circuit 101A includes a PMOS threshold generator 102A and an NMOS threshold generator 104A. A quantizer 106A is coupled to both the PMOS threshold generator 102A and the NMOS threshold generator 104A. An adjustable bias block 108A is coupled to the quantizer 106A, and to the bodies of the transistors T5, T6. The PMOS threshold generator 102A is coupled to an output of the adjustable bias block 108A in a feedback loop, and the NMOS threshold generator 104A is coupled to another output of the adjustable bias block 108A in a feedback loop.

Transistor T5 is a PMOS transistor having its source coupled to the first supply source Vdd, and its body coupled to an additional adjustable bias block 108A. Transistor T6 is an NMOS transistor having its drain coupled to the drain of transistor T5, its source coupled to ground GND, and its body coupled to the adjustable bias block 108A. The gates of transistors T5 and T6 are coupled together.

In operation, the additional body biasing circuit 101A functions as the body biasing circuit 101 does. The PMOS threshold generator 102A estimates the threshold voltage of the PMOS transistor T5, and generates a signal Pth2 indicative thereof. Similarly, the NMOS voltage generator 104A estimates the threshold voltage of the NMOS transistor T6, and generates a signal Nth2 indicative thereof.

When the estimated threshold voltage Pth2 of PMOS transistors T5 is greater than the reference PMOS threshold voltage VrefP2, as determined by the quantizer 106A, the adjustable bias block 108A forward biases the body of the transistor T5. This is accomplished by setting the body biasing voltage to be less than a voltage at the source of the transistor T5. When the estimated threshold voltage Nth2 of the NMOS transistor T6 is greater than the reference NMOS threshold voltage VrefN2, as determined by the quantizer 106A, the adjustable bias block 108A forward biases the body of the transistor T6. This is accomplished by setting the body biasing voltage to be higher than a voltage at the source of the transistor T6.

When the estimated threshold voltage Pth2 of the PMOS transistor T5 is less than the reference PMOS threshold voltage VrefP2, as determined by the quantizer 106A, the adjustable bias block 108A reverse biases the body of the transistor T5. This is accomplished by setting the body biasing voltage to be greater than the voltage at the source of the PMOS transistor T5. When the estimated threshold voltage Nth2 of the NMOS transistor T6 is less than the reference NMOS threshold voltage VrefN2, as determined by the quantizer 106A, the adjustable bias block 108A reverse biases the body of the transistor T6. This is accomplished by setting the body biasing voltage to be less than the voltage at the source of the transistors T2, T4.

The quantizer 106A determines the difference between the estimated threshold voltages Nth2 and Pth2 and the reference threshold voltage VrefN2 and VrefP2 respectively, to generate the first and second signal applies to the adjustable bias block 108A. The biasing signal Vpw2 or Vnw2 is then accordingly increased or decreased, which ultimately results in the threshold voltage Vth of the transistors (Vthp for the PMOS transistor T5; Vthn for the NMOS transistors T6) being adjusted to match the reference threshold voltage VrefN2 or VrefP2.

Further implementation details of the body biasing circuit 101A are the same as described above with respect to the body biasing circuit 101 and need no further description herein.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
a transistor having a body;
a body biasing circuit comprising:
a threshold estimator circuit configured to estimate a threshold voltage of the transistor;
a comparison circuit configured to compare the estimated threshold voltage of the transistor to a reference threshold voltage and to generate a comparison signal based thereupon;
a bias adjust circuit configured to generate a body biasing voltage that biases the body of the transistor as a function of the comparison signal, the body biasing voltage being a voltage that, when applied to the body of the transistor, adjusts the threshold voltage thereof to be equal to the reference threshold voltage;
wherein the threshold estimator circuit includes a replica transistor that is a replica of the transistor and that has its body biased by the body biasing voltage, the threshold estimator circuit estimating the threshold voltage of the transistor by:
determining first and second gate to source voltages of the replica transistor that are different; and
generating the estimation of the threshold voltage of the transistor as a function of a difference between the first and second gate to source voltages of the replica transistor.

2. The electronic device of claim 1, wherein the bias adjust circuit forward biases the body of the transistor in response to the comparison signal indicating that the threshold voltage is greater than the reference threshold voltage.

3. The electronic device of claim 2, wherein the transistor comprises a PMOS transistor having a source and a body; and wherein the bias adjust circuit forward biases the body of the PMOS transistor by setting the body biasing voltage to be less than a voltage at the source of the PMOS transistor.

4. The electronic device of claim 2, wherein the transistor comprises an NMOS transistor having a source and a body; and wherein the bias adjust circuit forward biases the body of the NMOS transistor by setting the body biasing voltage to be higher than a voltage at the source.

5. The electronic device of claim 1, wherein the bias adjust circuit reverse biases the body of the transistor in response to the comparison signal indicating that the threshold voltage is less than the reference threshold voltage.

6. The electronic device of claim 5, wherein the transistor comprises a PMOS transistor having a source and a body; and wherein the bias adjust circuit reverse biases the body of the PMOS transistor by setting the body biasing voltage to be greater than a voltage at the source.

7. The electronic device of claim 5, wherein the transistor comprises an NMOS transistor; and wherein the bias adjust circuit reverse biases the body by setting the body biasing voltage to be less than a voltage at a source of the NMOS transistor.

8. The electronic device of claim 1, further comprising an additional transistor having a body, and an additional threshold estimator circuit configured to estimate a threshold voltage of the additional transistor; wherein the comparison circuit is configured to compare the threshold voltage of the additional transistor to an additional reference threshold voltage and to generate an additional comparison signal based thereupon; and wherein the bias adjust circuit is also configured to generate an additional body biasing voltage that biases the body of the additional transistor as a function of the additional comparison signal, the additional body biasing voltage being a voltage that, when applied to the body of the additional transistor, adjusts the threshold voltage thereof to be equal to the additional reference threshold voltage.

9. The electronic device of claim 8, wherein the bias adjust circuit generates the body biasing voltage and additional body biasing voltage such that the threshold voltages of the transistor and additional transistor are equal.

10. The electronic device of claim 8, wherein the bias adjust circuit generates the body biasing voltage and additional body biasing voltage such that the threshold voltages of the transistor and additional transistor are not equal.

11. An electronic device comprising:
a transistor having a body;
a body biasing circuit comprising:
　a threshold estimator circuit comprising a replica transistor that is a replica of the transistor, the threshold estimator circuit configured to estimate a threshold voltage of the transistor by determining a threshold voltage of the replica transistor,
　a comparison circuit configured to compare the estimated threshold voltage of the transistor to a reference threshold voltage and to generate a comparison signal based thereupon;
　a bias adjust circuit configured to generate a body biasing voltage that biases the body of the transistor as a function of the comparison signal, the body biasing voltage being a voltage that, when applied to the body of the transistor, adjusts the threshold voltage thereof to be equal to the reference threshold voltage;
wherein the threshold estimator circuit comprises:
　a replicator circuit that is configured to receive the body biasing voltage as feedback and generate a replica of a gate to source voltage of the transistor, the replicator circuit including the replica transistor;
　a sample-hold circuit configured to store the replica of the gate to source voltage of the transistor responsive to first and second clocks and first and second reference currents so as to obtain first and second replica gate to source voltages; and
　an integrator circuit configured to integrate a difference between the first replica gate to source voltage and the second replica gate to source voltage so as to produce the estimated threshold voltage of the transistor.

12. The electronic device of claim 11, wherein the transistor comprises a PMOS transistor; and wherein the replicator circuit comprises:
a first replica PMOS transistor having a source coupled to a first supply voltage, a drain coupled to a first node, a gate coupled to a second node, and a body coupled to receive the body biasing voltage;
a second PMOS transistor having a source coupled to the first node, a drain coupled to the second node, and a gate;
a first amplifier having an inverting terminal coupled to the first node, a non-inverting terminal coupled to a first voltage, and an output coupled to the gate of the second PMOS transistor;
first and second switches coupled to the second node, the first switch controlled by the first clock, the second switch controlled by the second clock;
a second current source coupled between the first switch and ground; and
a first current source coupled between the second switch and ground;
wherein the replica of the gate to source voltage change of the PMOS transistor is reflected at the second node.

13. The electronic device of claim 12, wherein the sample-hold circuit comprises:
a buffer having an input coupled the second node and an output coupled to a third node;
a fourth switch coupled between the third node and a fourth node, the fourth switch configured to be closed at the second clock;
a third switch coupled between the fourth node and one half a sum of the first voltage and the first supply voltage, the third switch configured to be closed at the first clock;
a second capacitor coupled between the fourth node and a fifth node;
a first capacitor coupled between the third node and the fifth node;
a fifth switch coupled between the fifth node and ground, the fifth switch configured to be closed at the first clock; and
a sixth switch coupled between the fifth node and a sixth node, the sixth switch configured to be closed at the second clock.

14. The electronic device of claim 11, wherein the transistor comprises an NMOS transistor; and wherein the replicator circuit comprises:
a first replica NMOS transistor having a source coupled to ground, a drain coupled to a first node, a gate coupled to a second node, and a body coupled to receive the body biasing voltage;
a second NMOS transistor having a source coupled to the first node, a drain coupled to the second node, and a gate;
a first amplifier having a non-inverting terminal coupled to a first voltage, an inverting terminal coupled to the first node, and an output coupled to the gate of the second NMOS transistor;
first and second switches coupled to the second node, the first switch controlled by a first clock, the second switch controlled by a second clock opposite in phase to the first clock;
a first current source coupled between a first supply voltage and the second switch; and
a second current source coupled between the first supply voltage and the first switch;
wherein the replica of the gate to source voltage of the NMOS transistor is reflected at the second node.

15. The electronic device of claim 14, wherein the sample-hold circuit comprises:
a buffer having an input coupled the second node an output coupled to a third node;

a third switch coupled between the third node and a fourth node, the third switch configured to be closed at the first clock;
a fourth switch coupled between the fourth node and one half the first voltage, the fourth switch configured to be closed at the second clock;
a second capacitor coupled between the fourth node and a fifth node;
a first capacitor coupled between the third node and the fifth node;
a fifth switch coupled between the fifth node and ground, the fifth switch configured to be closed at the first clock; and
a sixth switch coupled between the fifth node and a sixth node, the sixth switch configured to be closed at the second clock.

16. The electronic device of claim 15, wherein the integrator circuit comprises:
a second amplifier having an inverting terminal coupled to the sixth node, a non-inverting terminal coupled to a second supply voltage, and an output coupled to a seventh node;
a third capacitor coupled between the sixth node and the seventh node; and
a seventh switch coupled between the sixth node and the seventh node, the seventh switch configured to be closed at the first clock;
wherein the estimated threshold voltage of the transistor is produced at the seventh node.

17. The electronic device of claim 1, further comprising:
an additional transistor;
an additional body biasing circuit comprising:
an additional threshold estimator circuit configured to estimate a threshold voltage of the additional transistor,
an additional comparison circuit configured to compare the threshold voltage of the additional transistor to an additional reference threshold voltage and to generate an additional comparison signal based thereupon;
an additional bias adjust circuit configured to generate an additional body biasing voltage that biases the body of the additional transistor as a function of the additional comparison signal, the additional body biasing voltage being a voltage that, when applied to the body of the additional transistor, adjusts the threshold voltage thereof to be equal to the additional reference threshold voltage.

18. A method, comprising:
estimating a threshold voltage of a transistor by determining a threshold voltage of a replica transistor, the threshold voltage being a voltage between a gate of the replica transistor and source of the replica transistor above which current flows between a drain of the replica transistor and the source of the replica transistor;
comparing the estimated threshold voltage of the transistor to a reference threshold voltage;
generating a body biasing voltage that biases a body of the transistor as a function of the comparison, the body biasing voltage being a voltage that, when applied to the body of the transistor, adjusts the threshold voltage of the transistor to be equal to the reference threshold voltage;
wherein the threshold voltage of the replica transistor is estimated by:
determining first and second gate to source voltages of the replica transistor that are different; and
generating the estimation of the threshold voltage of the transistor as a function of a difference between the first and second gate to source voltages of the replica transistor.

19. The method of claim 18, wherein the body biasing voltage is generated so as to forward bias the body of the transistor, in response to the comparison indicating that the threshold voltage is greater than the reference threshold voltage.

20. The method of claim 18, wherein the body biasing voltage is generated so as to reverse bias the body of the transistor, in response to the comparison indicating that the threshold voltage is less than the reference threshold voltage.

21. An electronic device, comprising:
at least one transistor having a gate, a source, a drain, and a body;
a replica transistor being a replica of the at least one transistor and having a gate, a source, and a drain;
a body biasing circuit configured to:
estimate a threshold voltage of the at least one transistor by determining a threshold voltage of a replica transistor, the estimated threshold voltage being a voltage between the gate and the source of the replica transistor above which current flows between the drain and source of the replica transistor,
compare the estimated threshold voltage of the at least one transistor to a reference threshold voltage,
generate a body biasing voltage that biases the body of the at least one transistor as a function of the comparison, the body biasing voltage being a voltage that, when applied to the body of the at least one transistor, adjusts a threshold voltage of the at least one transistor to be equal to the reference threshold voltage,
wherein the body biasing circuit estimates the threshold voltage of the at least one transistor by:
determining first and second gate to source voltages of the replica transistor that are different, and
generating the estimation of the threshold voltage of the at least one transistor as a function of the first and second gate to source voltages of the replica transistor.

22. The electronic device of claim 21, wherein the body biasing circuit estimates the threshold voltage of the at least one transistor by measuring the threshold voltage of the replica transistor, the replica transistor having a same width to length ratio as the at least one transistor.

23. The electronic device of claim 21, wherein the body biasing circuit generates the body biasing voltage so as to forward bias the body of the at least one transistor, in response to the comparison indicating that the threshold voltage is greater than the reference threshold voltage.

24. The electronic device of claim 21, wherein the body biasing circuit generates the body biasing voltage so as to reverse bias the body of the at least one transistor, in response to the comparison indicating that the threshold voltage is less than the reference threshold voltage.

25. The electronic device of claim 11, wherein the bias adjust circuit forward biases the body of the transistor in response to the comparison signal indicating that the threshold voltage is greater than the reference threshold voltage.

26. The electronic device of claim 25, wherein the transistor comprises a PMOS transistor having a source and a body; and wherein the bias adjust circuit forward biases the body of the PMOS transistor by setting the body biasing voltage to be less than a voltage at the source of the PMOS transistor.

27. The electronic device of claim 25, wherein the transistor comprises an NMOS transistor having a source and a body; and wherein the bias adjust circuit forward biases the body of the NMOS transistor by setting the body biasing voltage to be higher than a voltage at the source.

28. The electronic device of claim 11, wherein the bias adjust circuit reverse biases the body of the transistor in response to the comparison signal indicating that the threshold voltage is less than the reference threshold voltage.

29. The electronic device of claim 28, wherein the transistor comprises a PMOS transistor having a source and a body; and wherein the bias adjust circuit reverse biases the body of the PMOS transistor by setting the body biasing voltage to be greater than a voltage at the source.

30. The electronic device of claim 28, wherein the transistor comprises an NMOS transistor; and wherein the bias adjust circuit reverse biases the body by setting the body biasing voltage to be less than a voltage at a source of the NMOS transistor.

31. The electronic device of claim 11, further comprising an additional transistor having a body, and an additional threshold estimator circuit configured to estimate a threshold voltage of the additional transistor; wherein the comparison circuit is configured to compare the threshold voltage of the additional transistor to an additional reference threshold voltage and to generate an additional comparison signal based thereupon; and wherein the bias adjust circuit is also configured to generate an additional body biasing voltage that biases the body of the additional transistor as a function of the additional comparison signal, the additional body biasing voltage being a voltage that, when applied to the body of the additional transistor, adjusts the threshold voltage thereof to be equal to the additional reference threshold voltage.

32. The electronic device of claim 31, wherein the bias adjust circuit generates the body biasing voltage and additional body biasing voltage such that the threshold voltages of the transistor and additional transistor are equal.

33. The electronic device of claim 31, wherein the bias adjust circuit generates the body biasing voltage and additional body biasing voltage such that the threshold voltages of the transistor and additional transistor are not equal.

* * * * *